United States Patent
Hu et al.

(10) Patent No.: US 6,800,565 B2
(45) Date of Patent: Oct. 5, 2004

(54) METHOD OF FORMING THIN OXIDATION LAYER BY CLUSTER ION BEAM

(75) Inventors: Chih-Ching Hu, Rochester, NY (US); Adrian J. Devasahayam, Woodmere, NY (US); Patricia L. Cox, Rochester, NY (US); Chih-Ling Lee, Rochester, NY (US); Ming Mao, Pleasanton, CA (US); Jacques C. S. Kools, Sunnyvale, CA (US)

(73) Assignee: Veeco Instruments, Inc., Woodbury, NY (US)

( * ) Notice: Subject to any disclaimer, the term of this patent is extended or adjusted under 35 U.S.C. 154(b) by 11 days.

(21) Appl. No.: 10/341,282

(22) Filed: Jan. 13, 2003

(65) Prior Publication Data

US 2004/0137645 A1 Jul. 15, 2004

(51) Int. Cl.$^7$ ............................................... H01L 21/31
(52) U.S. Cl. ........................ 438/758; 438/706; 438/712
(58) Field of Search ................................ 438/758, 712, 438/706

(56) References Cited

U.S. PATENT DOCUMENTS

| | | | | |
|---|---|---|---|---|
| 5,296,122 | A | * 3/1994 | Katsube et al. | 204/298.04 |
| 5,527,731 | A | * 6/1996 | Yamamoto et al. | 250/492.3 |
| 6,407,890 | B1 | * 6/2002 | Gill | 360/314 |
| 6,452,763 | B1 | * 9/2002 | Gill | 360/324.11 |
| 6,473,278 | B1 | * 10/2002 | Gill | 360/324.12 |
| 6,482,657 | B2 | * 11/2002 | Shimazawa | 438/3 |
| 6,496,337 | B1 | * 12/2002 | Wang et al. | 360/324.12 |
| 6,498,107 | B1 | * 12/2002 | Fenner | 438/706 |
| 2002/0012812 | A1 | 1/2002 | Hasegawa et al. | 428/692 |
| 2002/0041473 | A1 | 4/2002 | Hoshiya et al. | 360/324.11 |
| 2002/0085322 | A1 | 7/2002 | Pinarbasi | 360/324.12 |
| 2002/0126426 | A1 | 9/2002 | Gill | 360/324.12 |
| 2002/0126428 | A1 | 9/2002 | Gill | 360/324.12 |
| 2002/0159205 | A1 | 10/2002 | Kula et al. | 360/324.11 |
| 2002/0171100 | A1 | 11/2002 | Pohm | 257/310 |

OTHER PUBLICATIONS

H. J. M. Swagten et al., *Enhanced Giant Mangetoresistance in Spin–Valves Sandwiched Between Insulating NiO*, Physical Review B, vol. 53, No. 14, pp. 9108–9114, Apr. 1, 1996.
W. F. Engelhoff, Jr. et al., *Oxygen As a Surfactant in the Growth of Giant Magnetoresistance Spin Valves*, J. Appl. Phys., vol. 82, No. 12, pp. 6142–6151, Dec. 15, 1997.

* cited by examiner

Primary Examiner—John F. Niebling
Assistant Examiner—Olivia T. Luk
(74) Attorney, Agent, or Firm—Wood, Herron & Evans, LLP (57) ABSTRACT

A method of forming a thin-film magnetic element, such as a TMR element or a spin valve element, on a substrate wherein at least a surface portion of a nonmagnetic metal layer is oxidized by cluster ion beam (CIB) oxidation. Specifically, the method comprises depositing a first magnetic layer on a substrate, then depositing a nonmagnetic metal layer on the first magnetic layer. At least a top surface of the nonmagnetic layer is oxidized by CIB oxidation. In one embodiment, only a top surface portion is oxidized such that a nano-oxide layer (NOL) is formed on a nonmagnetic conductive layer. In another embodiment, the nonmagnetic metal layer is oxidized throughout it's thickness such that the layer is converted to a nonmagnetic insulating film. After oxidation, a second magnetic layer is deposited on the oxidized layer. Oxidizing by cluster ion beam oxidation advantageously comprises mixing a pressurized inert carrier gas with oxygen gas to form a gas mixture and passing the gas mixture into a low pressure vacuum to produce a supersonic gas jet, whereby expansion occurs in the jet to cause formation of clusters of inert gas and oxygen atoms and molecules. The clusters are then ionized and focused into a cluster ion beam and accelerated toward the top surface of the nonmagnetic metal layer to bombard the top surface and react the ionized oxygen atoms and molecules with at least the top surface of the nonmagnetic metal layer.

23 Claims, 6 Drawing Sheets

METHOD OF FORMING THIN OXIDATION LAYER BY CLUSTER ION BEAM

FIELD OF THE INVENTION

The present invention relates to a cluster ion beam (CIB) method for forming thin oxidation layers in devices used for data storage and retrieval or any application in which detection of small magnetic fields is the method of operation. For example, the CIB method is applicable for forming specular reflecting layers in spin valve sensors for increasing the giant magnetoresistive ratio of the magnetic element, or for forming tunnel barrier layers in tunnel magnetoresistive devices.

BACKGROUND OF THE INVENTION

Computer systems generally utilize auxiliary memory storage devices having media on which data can be written and from which data can be read for later use. A direct access storage device (disk drive) incorporating rotating magnetic disks is commonly used for storing data in magnetic form on the disk surfaces. Magnetic heads, including read sensors, are then used to read data from the disk surfaces.

In high capacity disk drives, magnetoresistive read sensors (MR sensors) are the prevailing read sensors. An MR sensor detects a magnetic field through the change in resistance of its MR sensing layer (MR element) as a function of the strength and direction of the magnetic flux being sensed by the MR layer.

One type of MR sensor is the giant magnetoresistance (GMR) sensor manifesting the GMR effect, and another type is a tunnel magnetoresistance (TMR) sensor manifesting the TMR effect. In GMR sensors, the resistance of the MR element varies as a function of the spin-dependent transmission of the conduction electrons between magnetic layers separated by a nonmagnetic, conductive layer (spacer) and the accompanying spin-dependent scattering which takes place at the interface of the magnetic and nonmagnetic layers and within the magnetic layers. In TMR sensors, the resistance of the MR element varies as a function of the tunneling current allowed to pass between magnetic layers through a nonmagnetic, insulating layer (barrier layer).

GMR sensors using two layers of ferromagnetic material separated by a layer of nonmagnetic electrically conductive material are generally referred to as spin valve (SV) sensors manifesting the GMR effect. In a spin valve sensor, one of the ferromagnetic layers, referred to as the pinned layer, has its magnetization typically pinned by exchange coupling with an antiferromagnetic layer. The magnetization of the other ferromagnetic layer, referred to as the free layer, is not fixed and is free to rotate in response to the field from the recorded magnetic medium. In spin valve sensors, the spin valve effect varies as the cosine of the angle between the magnetization of the pinned layer and the magnetization of the free layer. Recorded data can be read from a magnetic medium because the external magnetic field from the recorded magnetic medium causes a change in the direction of the magnetization in the free layer, which in turn causes a change in resistance of the spin valve sensor and a corresponding change in the sensed current or voltage.

Figure 1:
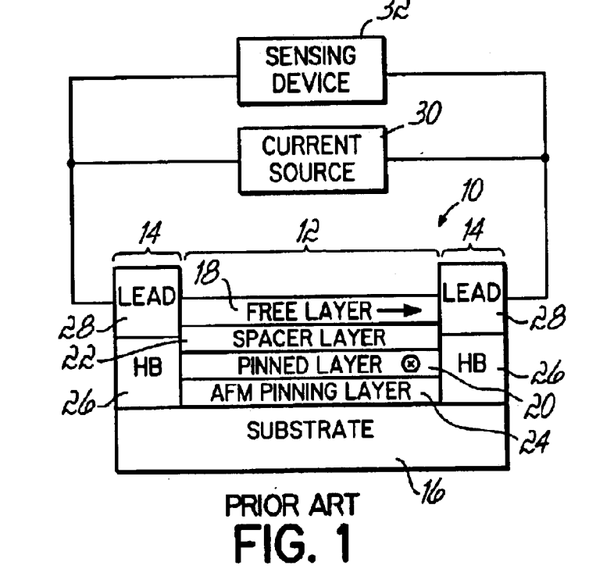
FIG. 1 is an air bearing surface (ABS) view of a simple bottom spin valve of the prior art.

FIG. 1 shows a typical simple spin valve 10 (not drawn to scale) comprising a central region 12 separating end regions 14 formed on a substrate 16. In central region 12, a free layer (free ferromagnetic layer) 18 is separated from a pinned layer 20 (pinned ferromagnetic layer) by a nonmagnetic, electrically-conducting spacer layer 22. The magnetization of the pinned layer 20 is fixed through exchange coupling with an antiferromagnetic (AFM) layer 24. FIG. 1 is an air bearing surface (ABS) view, and the arrows indicate that the free layer 18 has a magnetization direction, in the absence of an external magnetic field, parallel to the ABS and the pinned layer 20 has a magnetization direction perpendicular or 90° to the ABS, wherein the ABS is an exposed surface of the sensor that faces the magnetic medium. Hard biased layers 26 are formed in the end regions 14 to provide longitudinal bias for the free layer 18. Leads 28 are formed over hard biased layers 26 and provide electrical connections for the flow of a sensing current from a current source 30 to the sensor 10. Sensor device 32 is connected to leads 28 and senses the change in the resistance due to the changes induced in the free layer 18 by the external magnetic field. The construction depicted in FIG. 1 is the simplest construction for a spin valve sensor, and is well known in the art.

Another type of spin valve sensor is an antiparallel (AP) pinned spin valve sensor. In this type of magnetic element, a laminated AP pinned layer structure is substituted for the single pinned layer in FIG. 1. The AP pinned layer structure includes a nonmagnetic AP coupling layer (APC layer) between first and second AP pinned layers (AP1 and AP2, respectively). The AP1 pinned layer is exchange coupled to the antiferromagnetic pinning layer, which pins the magnetic moment (magnetization direction) of the AP1 pinned layer in the same direction as the magnetic spins of the pinning layer. By exchange coupling between the AP1 and AP2 layers, the magnetic moment of the AP2 pinned layer is pinned antiparallel to the magnetic moment of the AP1 pinned layer. An advantage of the AP pinned layer structure is that demagnetization fields of the AP1 and AP2 pinned layers partially counterbalance one another so that a small demagnetization field is exerted on the free layer for improved biasing of the free layer.

Figure 2:
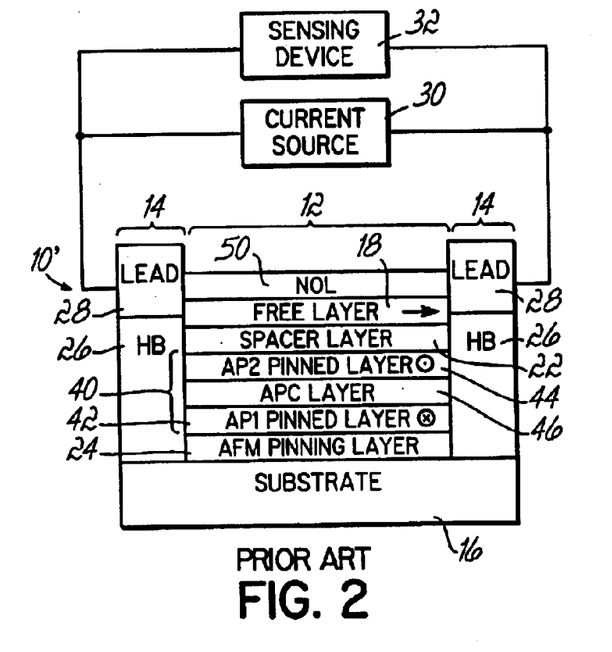
FIG. 2 is an ABS view of an AP pinned bottom spin valve of the prior art.

FIG. 2 shows an exemplary AP pinned spin valve sensor 10' (not drawn to scale) of the prior art. As with sensor 10 of FIG. 1, spin valve sensor 10' has a central region 12 separating end regions 14 formed on substrate 16. AP pinned spin valve sensor 10' comprises free layer 18 separated from a laminated AP pinned layer structure 40 by spacer layer 22. The magnetization of the laminated AP pinned layer structure 40 is fixed by the AFM pinning layer 24. The laminated AP pinned layer structure 40 includes a first ferromagnetic layer (AP1 layer) 42 and a second ferromagnetic layer (AP2 layer) 44 separated from each other by an antiparallel coupling layer (APC layer) 46. As with sensor 10 in FIG. 1, hard bias layers 26 are formed in end regions 14 to provide longitudinal biasing for the free layer 18, and electrical leads 28 provide electrical current from current source 30 to the spin valve sensor 10'. Sensor device 32 is connected to leads 28 to sense the change in resistance due to changes induced in the free layer 18.

Various parameters of a spin valve sensor may be used to evaluate the performance thereof. Examples of such parameters include the structure sheet resistance (R) and the GMR ratio (ΔR/R), also referred to as the GMR coefficient. The GMR ratio is defined as $(R_{AP}-R_P)/R_P$, where $R_{AP}$ is the antiparallel resistance and $R_P$ is the parallel resistance. The GMR ratio is an expression of the magnitude of the sensor response, and thus, the operation of a spin valve sensor is maximized by maximizing the GMR ratio. The GMR effect depends on the angle between the magnetizations of the free and pinned layers. In a spin valve sensor, the electron scattering, and therefore the resistance, is maximum when the magnetizations of the pinned and free layers are antiparallel, i.e., a majority of the electrons are scattered as they try to cross the boundary between the MR layers. On the other hand, electron scattering and therefore the resistance is minimum when the magnetizations of the pinned and free layers are parallel, i.e., a majority of electrons are not scattered as they try to cross the boundary between the MR layers. Thus, there is net change in resistance of a spin valve sensor between parallel and antiparallel magnetization orientations of the pinned and free layers. The GMR effect, i.e., the net change in resistance, exhibited by a typical prior art spin valve sensor, such as that shown in FIG. 2, is about 6% to 8%.

The disk drive industry has been engaged in an ongoing effort to increase the overall sensitivity, or GMR ratio, of the spin valve sensors to permit the drive head to read smaller changes in magnetic flux. Higher GMR ratios enable the storage of more bits of information on any given disk surface, and ultimately provide for higher capacity disk drives without a corresponding increase in the size or complexity of the disk drives.

It is well known that the addition of specular reflecting layers increases the GMR ratio of spin valve films. The GMR ratio is highly dependent upon the specular scattering that occurs within the pinned layer and the free layer of the sensor, with higher specular scattering resulting in a higher GMR ratio. Specular reflectors may be formed of materials similar to the ferromagnetic material forming the pinned layer or the free layer. For example, oxides of cobalt, iron and nickel, or a mixture of these oxides, are suitable as specular reflecting materials. These specular reflectors may be formed by oxidizing the ferromagnetic film, or by sputtering onto the ferromagnetic film using an oxide target. The oxidized metal layers may also be referred to as nano-oxide layers (NOLs). Oxide layers are ideal reflectors due to their electronic properties.

The specular layers can be added to the free layer structure (free layer NOL 50), as shown in FIG. 2, as well as to the pinned layer structure (AP NOL or bottom NOL)(not shown). The AP NOL is particularly challenging because it is located in the middle of the pinned layer in a spin valve stack and therefore may affect the pinning strength and the growth of the layers on top of it. Bottom NOL spin valves formed by oxidizing CoFe may have enhanced GMR properties, but typically have degraded pinning strength and poor thermal stability, which has prevented the use of bottom NOL spin valves in production processes.

There is therefore a need to develop a method for forming an AP NOL layer and other specular reflecting layers in a spin valve thin-film magnetic element in which the GMR ratio is increased by the use of an AP NOL layer without degradation in pinning strength and thermal stability.

In other devices, such as a TMR device, either for magnetic recording heads or MRAM applications, wherein an oxide layer is formed between magnetic layers, natural oxidation is often used for oxidation of metal layers, which produces inconsistent results due to the low surface activation and low energy of the oxygen atoms. The oxide layer may also contribute to low thermal stability wherein the magnetic properties of the device are degraded after exposure to high temperature annealing. Because the device performance is critically dependant on the quality of this oxide layer, a repeatable and uniform method of oxidation is desired. The uniformity of the oxide relates to the device yield across a wafer. It is very challenging to produce a uniform oxide layer across a large wafer.

Thus, there is a need in any magnetic element application having an oxide/magnetic layer interface for an oxidation method that increases the bonding strength at the interface, increases the thermal stability of the device, and increases the consistency and repeatability of the oxidation results for production.

SUMMARY OF THE INVENTION

The present invention provides a method of forming a thin-film magnetic element on a substrate wherein at least a surface portion of a nonmagnetic metal layer is oxidized by cluster ion beam (CIB) oxidation. Specifically, the method comprises depositing a first magnetic layer on a substrate, then depositing a nonmagnetic metal layer on the first magnetic layer. At least a top surface of the nonmagnetic layer is then oxidized by CIB oxidation. In one embodiment, only a top surface portion is oxidized such that a nano-oxide layer (NOL) is formed from the nonmagnetic conductive layer. For example, the nonmagnetic metal layer may be a ruthenium APC layer in a bottom pinned structure of a spin valve, whereby an AP NOL layer comprising $RuO_x$ is formed by CIB oxidation of the top surface portion of the ruthenium. In another embodiment, the nonmagnetic metal layer is oxidized throughout its thickness such that the layer is converted to a nonmagnetic insulating film. For example, the nonmagnetic metal layer may be an aluminum layer for forming an $Al_2O_3$ tunnel barrier layer in a TMR device. After CIB oxidation, the method further comprises depositing a second magnetic layer on the oxidized layer whereby improved adhesion is achieved at the interface thereof.

In the method of the present invention, oxidizing by cluster ion beam oxidation advantageously comprises mixing a pressurized inert carrier gas, such as argon, with oxygen gas to form a gas mixture and passing the gas mixture into a low pressure vacuum to produce a supersonic gas jet, whereby expansion occurs in the jet to cause formation of clusters of inert gas and oxygen atoms and molecules. The clusters are then ionized to form cluster ions, which are then focused into a cluster ion beam and accelerated toward the top surface of the nonmagnetic metal layer to bombard the top surface and react the ionized oxygen molecules with at least the top surface of the nonmagnetic metal layer.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

The present invention provides a cluster ion beam (CIB) oxidation method for oxidizing a nonmagnetic metal layer or a surface portion thereof to form a thermally stable magnetic device comprising the oxidized layer sandwiched between two magnetic layers, wherein the interface between the oxide and the magnetic layer is strongly adhered and device maintains it's magnetic pinning properties. In one embodiment, the present invention provides a method for forming a thermally stable AP pinned spin valve magnetic element having a specular reflecting layer formed in the AP pinned structure by oxidizing a surface portion of the AP coupling layer by CIB oxidation. For example, a ruthenium oxide surface layer is formed on a ruthenium APC layer. In another embodiment, the present invention provides a method for forming a thermally stable TMR element having a tunnel barrier layer formed between two magnetic layers by oxidizing a nonmagnetic layer by CIB oxidation to convert it to a nonmagnetic insulating layer.

Figure 3:
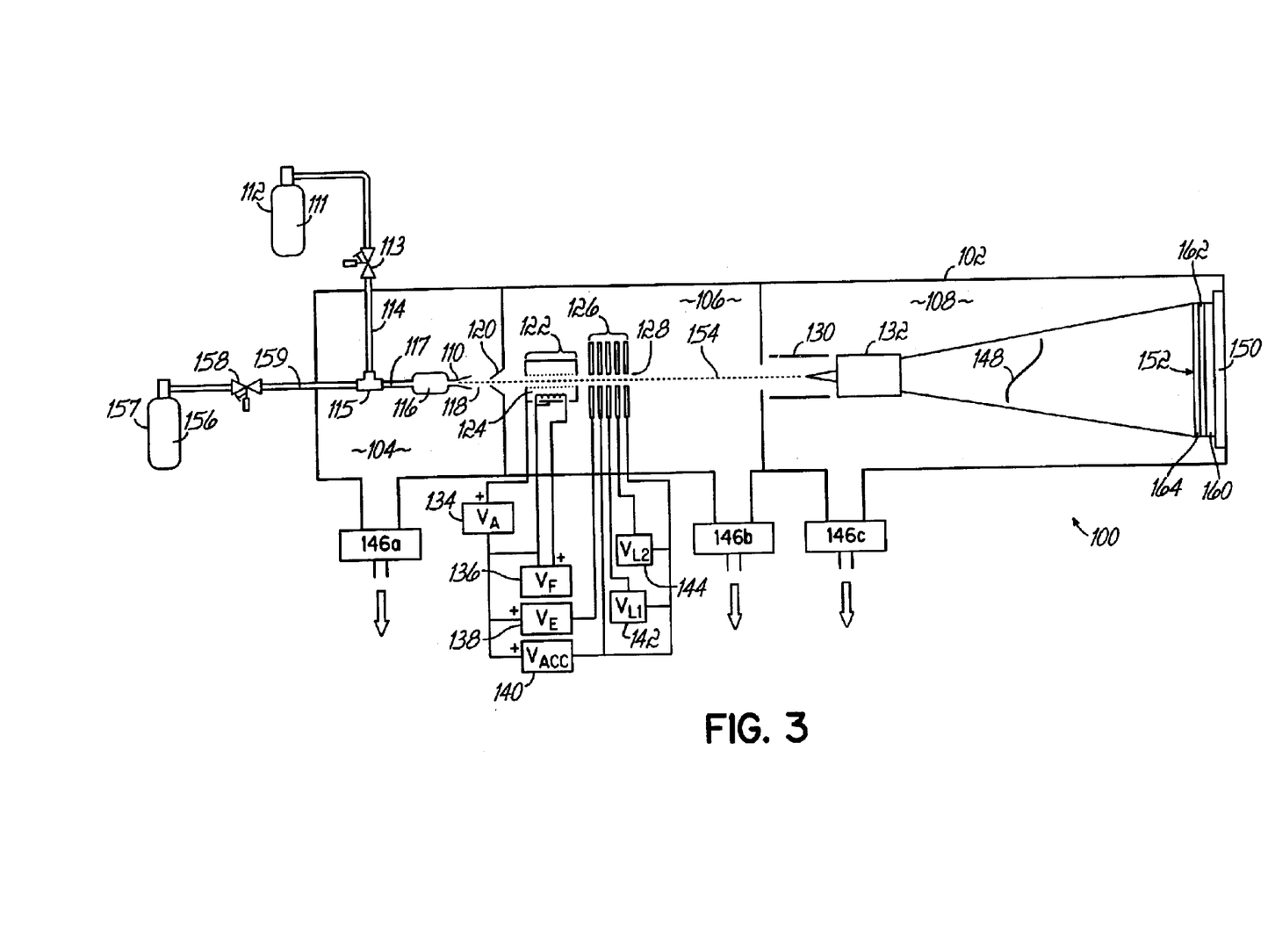
FIG. 3 is a schematic view of a CIB processing apparatus for performing the oxidation step of the method of the present invention.

FIG. 3 shows a configuration for a cluster ion bean (CIB) processing system 100, which has the capability to perform CIB oxidation in accordance with the method of the present invention. Other configurations may be used. A vacuum vessel 102 is divided into three communicating chambers, a source chamber 104, an ionization/acceleration chamber 106, and a processing chamber 108. The three chambers are evacuated to suitable operating pressures, for example less than $10^{-8}$ torr for the base pressure, by vacuum pumping systems 146a, 146b, and 146c, respectively. A condensable source gas 112, for example an inert carrier gas, stored in a cylinder 111 is admitted under pressure through gas metering valve 113 and gas feed tube 114 to a connector 115, such as a T-connector. The inert carrier gas 112 may be argon, xenon, krypton, neon, hydrogen, helium or mixtures thereof. Argon is an exemplary inert carrier gas. Oxygen gas 156 stored in a cylinder 157 is admitted under pressure through gas metering valve 158 and gas feed tube 159 to connector 115 where the oxygen gas 156 mixes with the inert gas 112 to form a gas mixture 117, which is fed into stagnation chamber 116. The gas mixture 117 is advantageously formed by a 100–400 sccm flow of the inert carrier gas 112 and a 2–100 sccm flow of the oxygen gas 156. More advantageously, the inert carrier gas 112 flow is 200–300 seem and the oxygen gas 156 flow is 10–35 sccm. In an exemplary embodiment, the gas mixture 117 comprises a volume ratio of argon:oxygen in the range of 7:1 to 25:1. The gas mixture 117 is ejected into the substantially lower pressure vacuum, for example $10^{-4}$ to $10^{-1}$ torr, through a properly shaped nozzle 110. A supersonic gas jet 118 results. Cooling, which results from the expansion in the jet, causes a portion of the gas jet 118 to condense into clusters, each consisting of several thousand weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, high voltage electrodes 126, and process chamber 108).

After the supersonic gas jet 118 containing gas clusters has been formed, the clusters are ionized in an ionizer 122. The ionizer 122 is advantageously an electron impact ionizer that produces thermoelectrons from one or more incandescent filaments 124 and accelerates and directs the electrons causing them to collide with the gas clusters in the gas jet 118, where the jet passes through the ionizer 122. The electron impact ejects electrons from the clusters, causing a portion of the clusters to become positively ionized. A set of suitably biased high voltage electrodes 126 extracts the cluster ions from the ionizer, forming a beam, then accelerates them to a desired energy and focuses them to form a CIB 128 having an initial trajectory 154. Filament power supply 136 provides voltage V, to heat the ionizer filament 124. Anode power supply 134 provides voltage $V_A$ to accelerate thermoelectrons emitted from filament 124 to cause them to bombard the cluster containing gas jet 118 to produce ions. Extraction power supply 138 provides voltage $V_E$ to bias a high voltage electrode to extract ions from the ionizing region of ionizer 122 and to form a CIB 128. Advantageously, the ion dose of the clusters is $10^{14}$ to $10^{16}$ ions/cm$^2$. Accelerator power supply 140 provides voltage $V_{Acc}$ to bias a high voltage electrode with respect to the ionizer 122 so as to result in a total CIB acceleration energy equal to $V_{Acc}$ electron volts (eV). Advantageously, the CIB 128 is accelerated by a $V_{Acc}$ of 300 eV to 10 keV, and more advantageously by a $V_{Acc}$ of 1–5 keV. One or more lens power supplies (142 and 144 shown for example) may be provided to bias high voltage electrodes with potentials ($V_{L1}$ and $V_{L2}$ for example) to focus the CIB 128. Two pairs of orthogonally oriented electrostatic scan plates 130 and 132 can be utilized to produce a raster or other scanning pattern across the desired processing area. When beam scanning is performed, the CIB 128 is converted into a scanned CIB 148, for scanning the entire surface of workpiece 152. In another embodiment, the cluster ion beam is left stationary while the substrate is rastered in an appropriate fashion.

The workpiece 152 is held on a workpiece holder 150, disposed in the path of the CIB 148. Workpiece 152 comprises a substrate 160 having a magnetic layer 162 thereon and a nonmagnetic layer 164 disposed on the magnetic layer 162 and facing the path of the CIB 148. Magnetic layer 162 and nonmagnetic layer 164 are deposited on the substrate 160 prior to placing the workpiece 152 in processing chamber 108. After oxidation, workpiece 152 is removed from processing chamber 108, and a second magnetic layer (not shown) is deposited on the oxidized surface without breaking vacuum i.e. the cluster ion beam oxidation is preformed "in-situ". Any appropriate known method may be used for depositing the magnetic and nonmagnetic layers, such as PVD, IBD (Ion Beam Deposition) or CVD.

Figure 4:
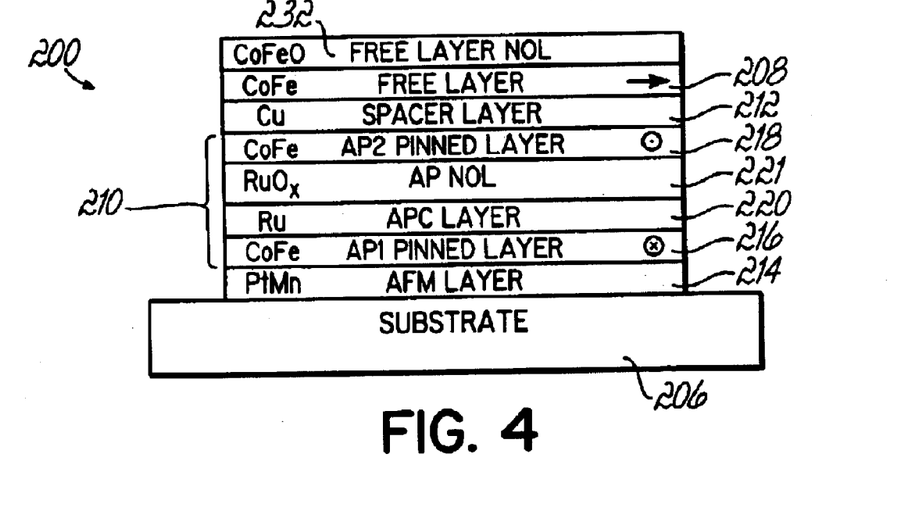
FIG. 4 is an ABS view of an AP pinned bottom spin valve formed by the method of the present invention.

An exemplary embodiment of an AP pinned bottom spin valve formed by the method of the present invention is depicted in FIG. 4 in an air bearing surface (ABS) view. Spin valve sensor 200 has a magnetic element in which an antiferromagnetic (AFM) pinning layer 214 is disposed on the substrate 206. The AFM pinning layer generally comprises one of an X—Mn alloy and a Pt—Mn—X' alloy, in which X is an element selected from the group consisting of Pt, Pd, Ir, Rh, Ru and Os, and X' is at least one element selected from the group consisting of Pd, Cr, Ru, Ni, Ir, Rh, Os, Au, Ag, Ne, Ar, Xe and Kr. Advantageously, the AFM pinning layer comprises PtMn.

A laminated AP pinned layer structure 210, which may also be referred to in the art as a synthetic pinned layer, is disposed on the AFM pinning layer 214. The AFM pinning layer 214 fixes the magnetization direction of the AP pinned layer structure 210. The laminated AP pinned layer structure 210 is formed by depositing a first magnetic pinned layer (AP1 layer) 216 on the AFM pinning layer 214, then depositing an AP coupling layer (APC layer) 220 on the AP1 layer 216. AP1 layer 216 and APC layer 220 may correspond to magnetic layer 162 and nonmagnetic layer 164, respectively, in the workpiece 152 of FIG. 3. In an exemplary embodiment, APC layer 220 comprises ruthenium. The top surface of APC layer 220 is then oxidized in accordance with the present invention by CIB oxidation, to form an oxidized surface portion 221 disposed on the APC layer 220. This oxidized surface portion 221 is also referred to herein as an AP specular reflecting layer or an AP NOL. In the exemplary embodiment, the Ru APC layer 220 is oxidized to form a $RuO_x$ AP NOL 221. A second pinned layer (AP2 layer) 218 is then deposited on the oxidized surface portion 221. In an exemplary embodiment, AP1 and AP2 comprise CoFe or NiFe.

A spacer layer 212, which comprises a nonmagnetic conductive material, such as copper, may then be deposited on the AP pinned layer structure 210, specifically on AP2 layer 218. Spacer layer 212 separates the AP pinned layer structure 210 from a magnetic free layer structure 208, which is disposed on the spacer layer 212. In an exemplary embodiment, free layer 208 includes an oxidized surface portion 232, also referred to herein as the free layer NOL or the free layer specular reflecting layer. The free layer NOL may be formed by any oxidation process, such as natural oxidation or CIB oxidation. Embodiments of AP pinned spin valves having an AP NOL layer which may be formed by the cluster ion beam oxidation process of the present invention are described in further detail in copending application Ser. No. 10/341,281 entitled "SPIN VALVE WITH THERMALLY STABLE PINNED LAYER STRUCTURE HAVING RUTHENIUM OXIDE SPECULAR REFLECTING LAYER," filed on even date herewith and incorporated by reference herein in its entirety.

Figure 5:
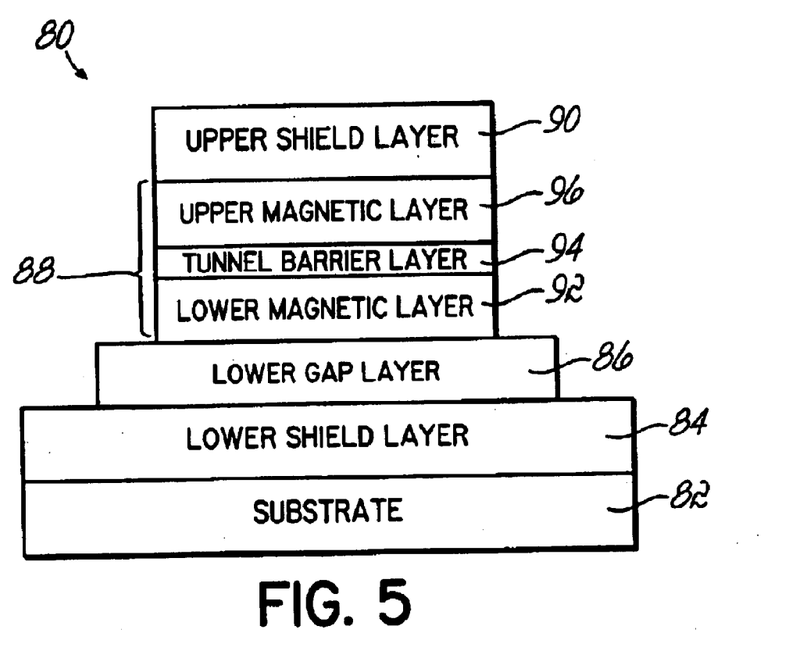
FIG. 5 is an ABS view of a TMR element in a thin-film magnetic head.

An exemplary embodiment of a thin-film magnetic head 80 having a TMR element 88 formed by the method of the present invention is depicted in FIG. 5 in an air bearing surface (ABS) view. The thin-film magnetic head 80 comprises a lower shield layer 84 formed on a substrate 82, a lower gap layer 86 formed on the lower shield layer 84, a TMR element 88 of this example formed on the lower gap layer 86, and an upper shield layer 90 formed on the TMR element 88.

The TMR element 88 is formed by depositing a lower magnetic layer 92, which functions as a free magnetic layer, on the lower gap layer 86, and then depositing a tunnel barrier layer 94 on the lower magnetic layer 92. Lower magnetic layer 92 and a metal precursor to tunnel barrier layer 94 may correspond to magnetic layer 162 and nonmagnetic layer 164, respectively, in the workpiece 152 of FIG. 3. In an exemplary embodiment, the metal precursor to tunnel barrier layer 94 comprises aluminum. The metal precursor layer is then oxidized throughout it's thickness in accordance with the present invention by CIB oxidation, to form an oxidized tunnel barrier layer 94 disposed on the lower magnetic layer 92. This oxidized layer 94 is a nonmagnetic insulating layer. In the exemplary embodiment, the Al precursor layer is oxidized to form an $Al_2O_3$ tunnel barrier layer 94. An upper magnetic layer 96, which functions as a pinned magnetic layer, is then deposited on the tunnel barrier layer 94. The free lower magnetic layer 92 contains a ferromagnetic substance and has a direction of magnetization that changes in response to an external magnetic field. The tunnel barrier layer 94 is a layer made of a thin nonmagnetic insulating film through which electrons are capable of passing while maintaining spins thereof by means of the tunnel effect, that is, through which a tunnel current is allowed to pass. The tunnel barrier layer 94 is advantageously made of any of $Al_2O_3$, NiO, GdO, MgO, $Ta_2O_5$, $MoO_2$, $TiO_2$, and $WO_2$, for example, wherein the nonmagnetic metal or precursor metal oxidized by the CIB method of the present invention is Al, Ni, Gd, Mg, Ta, Mo, Ti and W, respectively. The tunnel barrier layer 94 generally has a thickness of 0.5 to 2 nm, for example. The pinned or upper magnetic layer 96 contains a ferromagnetic substance and is pinned such that the direction of magnetization is kept constant regardless of an external field. In another embodiment, the locations of pinned layers 96 and free layer 92 can be switched to correspond to a "Bottom" configuration.

Without being bound by theory, the CIB oxidation method is believed to be capable of producing a bridge-type structure, or discontinuous oxide layer. In other words, the CIB oxidation process is believed to produce regions where there is no oxide, whereby the layer maintains good pinning properties and bonding strength, but also enough oxide regions for performing the function of the oxide layer, for example specular reflection in an AP pinned structure of a spin valve. With regards to the specular layer application, it is further hypothesized that the thermal stability of the NOL structure benefits from this bridge type structure or discontinuous oxide layer. For a tunnel barrier in a TMR element, the CIB process would be increased in dose so as to form a high quality continuous oxide, which is necessary for this application. For either continuous or discontinuous oxide formation, the cluster ion beam oxidation method provides more energy to the oxygen atoms to increase the surface activation and promote the reaction of oxygen with the nonmagnetic metal atoms. The bombarding energy is based upon the average energy per atom, which is easily adjustable by changing the cluster size and/or the acceleration energy ($V_{Acc}$). The CIB oxidation reaction provides a cleaner process environment because most of the oxygen molecules are directly sent to the desired surface for oxidation. The reaction energies and ion doses are also both extremely well controlled, leading to a consistent, repeatable oxidation method, which is needed for production processes.

EXAMPLES

The cluster ion beam oxidation method of the present invention was used to form a bottom AP pinned NOL on a ruthenium APC layer in a magnetic spin valve stack. The formed stack comprised, from the bottom up: NiFeCr45/CoFe10/PtMn120/CoFe16/Ru8.5/AP NOL-CIB/CoFe21/Cu20/CoFe35/Free NOL-natural, wherein the numbers following each component indicate the thickness of that component in angstroms. With the exception of the NOLs formed by CIEB oxidation and natural oxidation, the components of the stack were deposited by a physical vapor deposition (PVD) planetary system operating at a pressure of 10 mT for PtMn and 1 mT for all other components. After deposition of the Ru layer, the semiconductor wafer was transferred to a CIB system without breaking vacuum for oxidation of the surface of the Ru layer. Oxygen gas flows in the range of 10–35 sccm were mixed with argon gas flow at 250 sccm into a stagnation chamber. The clusters were ionized and accelerated to 2 keV and directed onto the Ru surface of the developing spin valve stack. An ion dose of $2.5 \times 10^{14}$ ions/$cm^2$ was used for the oxidation process. The wafer was then returned to the PVD planetary system for deposition of the remaining components. The CoFe free layer was oxidized by a natural oxidation process to form the free NOL. The spin valve stack was then annealed in a 1 Tesla aligning magnetic field at 280° C. for five hours. The GMR ratio ($\Delta R/R$) was measured using a quasi-static-tester (QST). The interlayer coupling results ($H_{int}$) were measured using a BH looper.

Figure 6A:
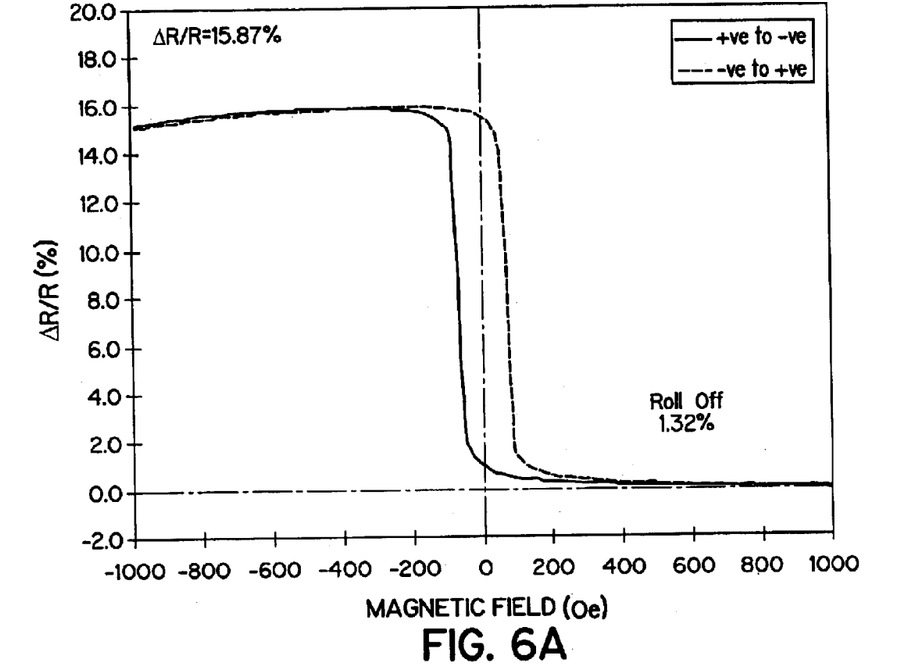
FIGS. 6A–6B are GMR-H traces for AP pinned spin valves having no AP NOL layer and an AP NOL formed by CIB oxidation, respectively.
Figure 6B:
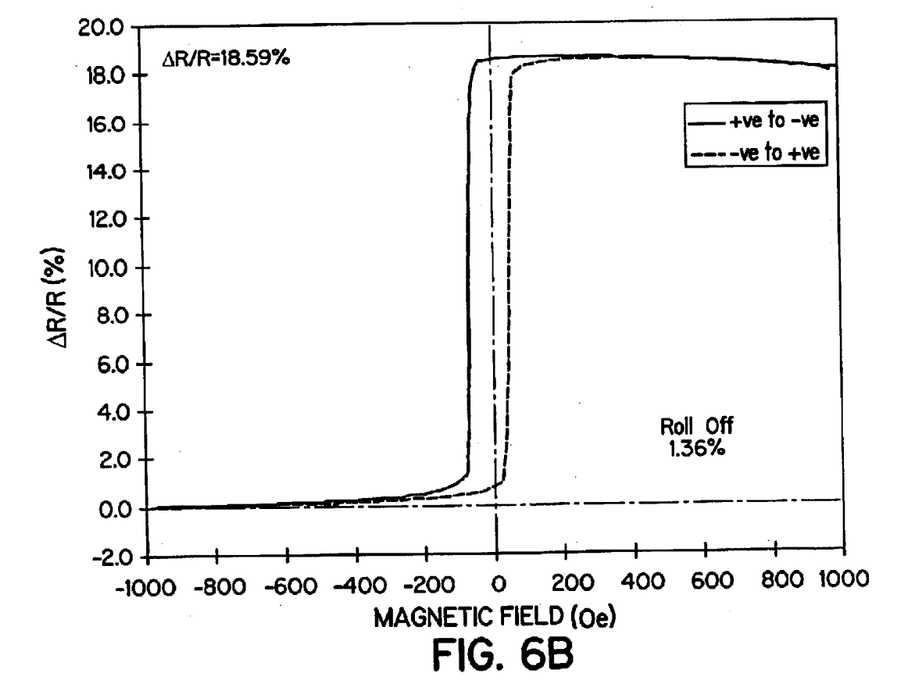

For comparison, a spin valve stack having no AP NOL-CIB layer was formed, and comprised from the bottom up: NiFeCr45/CoFe10/PtMn120/CoFe16/Ru8.5/CoFe21/Cu20/CoFe35/Free NOL-natural. FIGS. 6A and 6B depict GMR—H traces, wherein H refers to the external applied magnetic field in Oersteds. FIG. 6A illustrates the MR response for the spin valve having no AP NOL layer formed by CIB oxidation. This spin valve stack not formed in accordance with the method of the present invention exhibits a GMR ratio of 15.9%. FIG. 6B illustrates the MR response for the spin valve stack having an AP NOL layer formed by CIB oxidation in accordance with the method of the present invention. The method of the present invention improves the GMR ratio to 18.6%.

Figure 7:
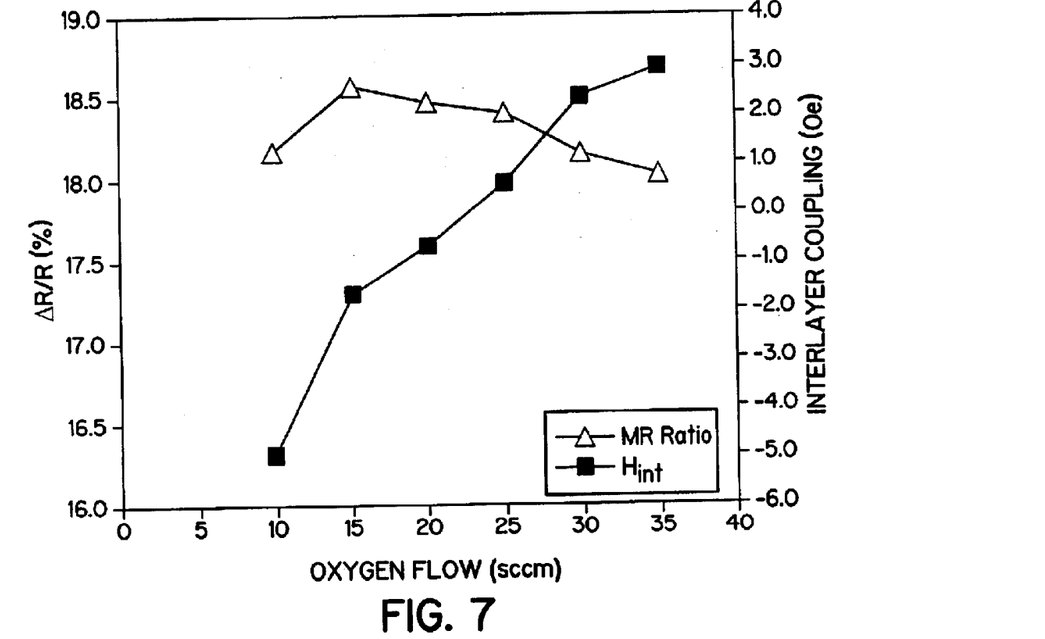
FIG. 7 is a plot of the GMR ratio and the $H_{int}$ as a function of oxygen flow.

To illustrate the good magnetic properties maintained by the pinned structure formed in accordance with the method of the present invention, FIG. 7 plots the GMR ratio and the interlayer coupling results as a function of oxygen gas flow. An argon gas flow of 250 sccm was combined with oxygen gas flow ranging from 10–35 sccm, such that the argon:oxygen volume ranged from 25:1 to about 7:1. All samples provided a GMR ratio above 18% with good pinning. A decrease in the interlayer coupling field is exhibited upon increasing concentration of oxygen. This is consistent with the hypothesis that the CIB oxidation method forms a discontinuous oxide layer whereby nonoxide portions of the NOL may contribute to maintaining the pinning properties of the layer.

Figure 8A:
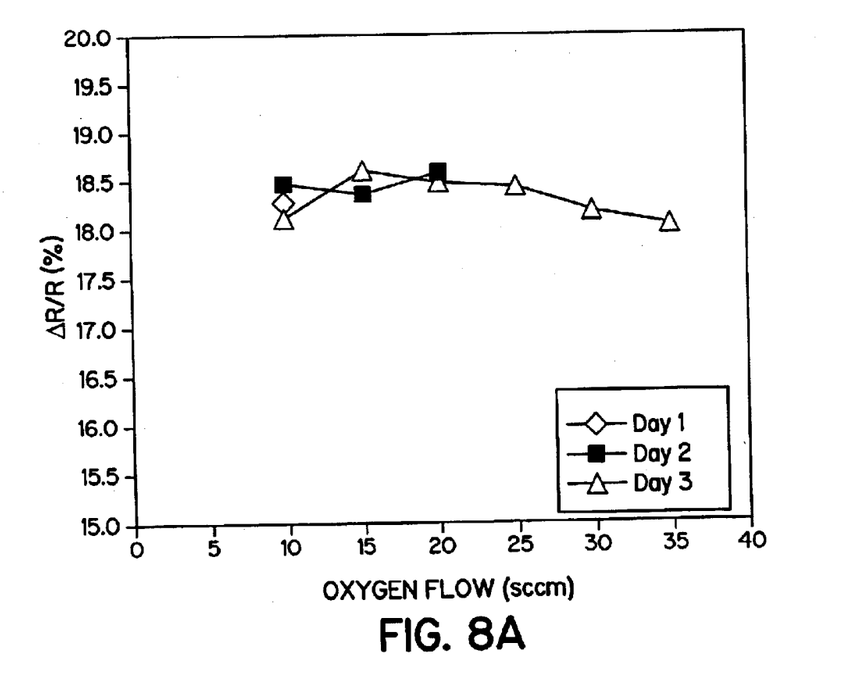
FIG. 8A is a plot of the GMR ratio as a function of oxygen flow for samples deposited and measured on different dates.
Figure 8B:
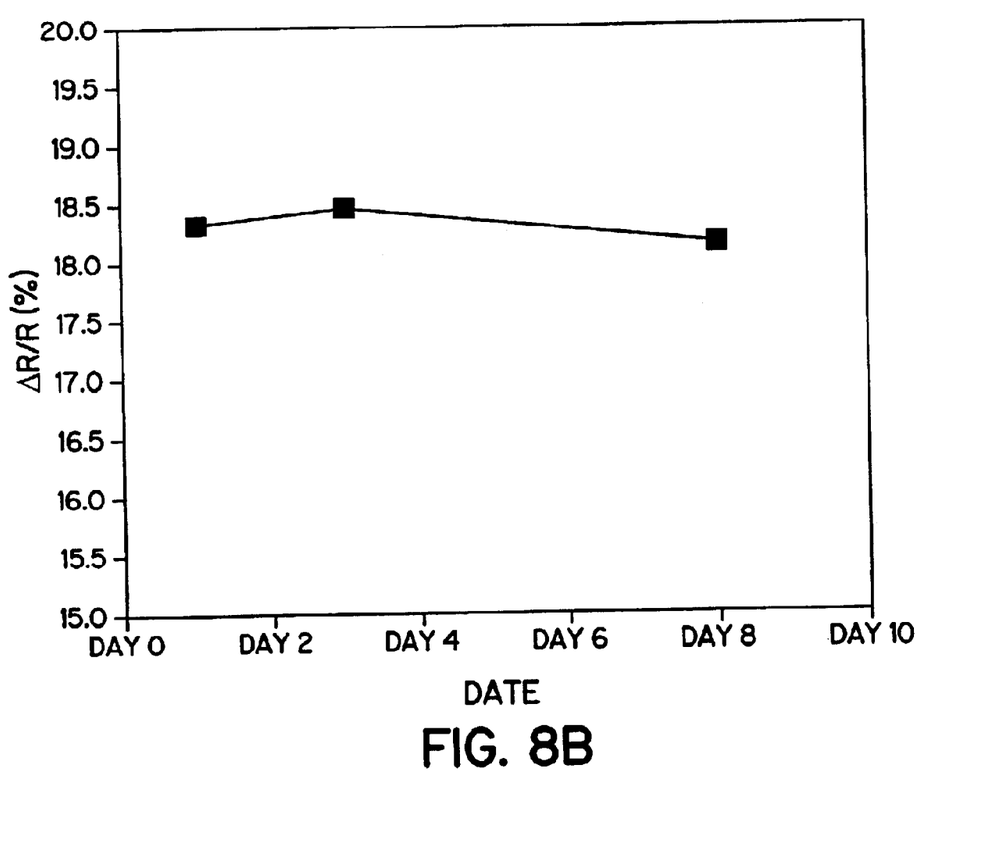
FIG. 8B is a plot of the GMR ratio for a given oxygen flow as a function of the date of deposition and testing.

The CIB oxidation method of the present invention also has good repeatability of the magnetic properties, as illustrated in FIGS. 8A and 8B, which distinguishes the method of the present invention from other oxidation methods. In FIG. 8A, the method was performed on three different dates, with various oxygen gas flows ranging from 10–35 sccm oxygen with a 250 sccm argon gas flow. FIG. 8B plots the GMR ratio for spin valve stacks formed on three different dates using an oxygen gas flow of 10 sccm and an argon gas flow of 250 sccm. In each test, the GMR ratio measured above 18% showing good repeatability of the method. Further, data taken at different dates using the same flow conditions showed less than 2% variation in the GMR ratio.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of the general inventive concept.

What is claimed is:

1. A method of forming a thin-film magnetic element on a substrate, comprising the steps of:
   depositing a first magnetic layer;
   depositing a nonmagnetic metal layer on the first magnetic layer;
   oxidizing at least a top surface of the nonmagnetic metal layer by cluster ion beam oxidation; and
   depositing a second magnetic layer on the oxidized top surface of the nonmagnetic metal layer.

2. The method of claim 1 wherein oxidizing by cluster ion beam oxidation comprises:
   mixing a pressurized inert carrier gas with oxygen gas to form a gas mixture;
   passing the gas mixture into a vacuum of pressure sufficiently low to produce a supersonic gas jet, whereby expansion occurs in the jet to cause formation of clusters of inert gas and oxygen atoms and molecules;
   ionizing the clusters to form cluster ions;
   focusing the cluster ions into a beam; and
   accelerating the beam of cluster ions toward the top surface of the nonmagnetic metal layer to bombard the top surface and react the ionized oxygen atoms and molecules with at least the top surface of the nonmagnetic metal layer.

3. The method of claim 2 wherein mixing the inert carrier gas with oxygen gas comprises combining a 100–400 sccm flow of the inert carrier gas with a 2–100 sccm flow of the oxygen gas.

4. The method of claim 2 wherein the inert carrier gas comprises argon, and mixing comprises combining a 200–300 sccm flow of the argon inert carrier gas with a 10–35 sccm flow of the oxygen gas.

5. The method of claim 2 wherein the pressure of the vacuum is $10^{-4}$ to $10^{-1}$ torr.

6. The method of claim 2 wherein ionizing is by electron impact ionization.

7. The method of claim 2 wherein the beam is accelerated by an accelerating voltage of 300 eV to 10 keV.

8. The method of claim 2 wherein the beam is accelerated by an accelerating voltage of 1–5 keV.

9. The method of claim 2 wherein the ion dose of the clusters is $10^{14}$ to $10^{16}$ ions/cm$^2$.

10. The method of claim 2 wherein the inert carrier gas is argon, xenon, krypton, neon, hydrogen, helium or a mixture thereof.

11. The method of claim 1 wherein the depositing steps are each performed in a deposition chamber, the method further comprising, after depositing the nonmagnetic metal layer, transferring the substrate to a cluster ion beam apparatus wherein the oxidizing step is performed, followed by transferring the substrate back to the deposition chamber.

12. The method of claim 1 wherein the nonmagnetic metal layer is a ruthenium antiparallel coupling layer in a bottom antiparallel pinned structure of a spin valve, and wherein the oxidizing converts only the top surface of the ruthenium antiparallel coupling layer to ruthenium oxide.

13. The method of claim 1 wherein the nonmagnetic metal layer is aluminum and wherein the oxidizing converts substantially the entire nonmagnetic metal layer to form an aluminum oxide tunnel barrier layer in a tunnel magnetoresistive device.

14. A method of forming a bottom spin valve, comprising the steps of:
   depositing an antiferromagnetic layer onto a substrate in a deposition chamber;
   depositing a first magnetic layer on the antiferromagnetic layer in the deposition chamber;
   depositing a ruthenium antiparallel coupling layer on the first magnetic layer in the deposition chamber;
   transferring the substrate to a cluster ion beam chamber and oxidizing a top surface of the ruthenium antiparallel coupling layer by a cluster ion beam oxidation method comprising:
      combining a pressurized inert carrier gas flow of 100–400 sccm with an oxygen gas flow of 2–100 sccm to form a gas mixture,
      passing the gas mixture into a vacuum of pressure sufficiently low to produce a supersonic gas jet, whereby expansion occurs in the jet to cause formation of clusters of inert gas and oxygen atoms and molecules, ionizing the clusters to form cluster ions, focusing the cluster ions into a beam, and accelerating the beam of cluster ions by an accelerating voltage of 300 eV to 10 keV toward the top surface of the ruthenium antiparallel coupling layer to bombard the surface with an ion dose in the range of $10^{14}$ to $10^{16}$ ions/cm$^2$ and react the ionized oxygen molecules with the top surface of the ruthenium antiparallel coupling layer;

transferring the substrate to the deposition chamber and depositing a second magnetic layer on the oxidized top surface of the ruthenium antiparallel coupling layer in the deposition chamber;

depositing a nonmagnetic spacer layer on the second magnetic layer in the deposition chamber; and depositing a third magnetic layer on the nonmagnetic spacer layer in the deposition chamber.

15. The method of claim 14 wherein the inert carrier gas comprises argon, and mixing comprises combining a 200–300 sccm flow of the argon inert carrier gas with a 10–35 sccm flow of the oxygen gas.

16. The method of claim 14 wherein the pressure of the vacuum is $10^{-4}$ to $10^{-1}$ torr.

17. The method of claim 14 wherein ionizing is by electron impact ionization.

18. The method of claim 14 wherein the beam is accelerated by an accelerating voltage of 1–5 keV.

19. A method of forming a tunnel magnetoresistive device, comprising the steps of:

depositing a lower magnetic layer on a substrate in a deposition chamber;

depositing a nonmagnetic metal layer on the lower magnetic layer in the deposition chamber;

transferring the substrate to a cluster ion beam chamber and oxidizing the nonmagnetic metal layer by a cluster ion beam oxidation method to form a nonmagnetic insulating film, the oxidation method comprising:

combining a pressurized inert carrier gas flow of 100–400 sccm with an oxygen gas flow of 2–100 sccm to form a gas mixture, passing the gas mixture into a vacuum of pressure sufficiently low to produce a supersonic gas jet, whereby expansion occurs in the jet to cause formation of clusters of inert gas and oxygen atoms and molecules, ionizing the clusters to form cluster ions, focusing the cluster ions into a beam, and accelerating the beam of cluster ions by an accelerating voltage of 300 eV to 10 keV toward the nonmagnetic metal layer to bombard the layer with an ion dose in the range of $10^{14}$ to $10^{16}$ ions/cm$^2$ and react the ionized oxygen molecules with the nonmagnetic metal layer; and transferring the substrate to the deposition chamber and depositing an upper magnetic layer on the nonmagnetic insulating film in the deposition chamber.

20. The method of claim 19 wherein the inert carrier gas comprises argon, and mixing comprises combining a 200–300 sccm flow of the argon inert carrier gas with a 10–35 sccm flow of the oxygen gas.

21. The method of claim 19 wherein the pressure of the vacuum is $10^{-4}$ to $10^{-1}$ torr.

22. The method of claim 19 wherein ionizing is by electron impact ionization.

23. The method of claim 19 wherein the beam is accelerated by an accelerating voltage of 1–5 keV.

* * * * *

UNITED STATES PATENT AND TRADEMARK OFFICE
CERTIFICATE OF CORRECTION

PATENT NO. : 6,800,565 B2
DATED : October 5, 2004
INVENTOR(S) : Hu et al.

It is certified that error appears in the above-identified patent and that said Letters Patent is hereby corrected as shown below:

Title page,
Item [56], References Cited, OTHER PUBLICATIONS, reads "H. J. M. Swagten et al., *Enhanced Giant Mangetoresistance in Spin-Valves Sandwiched Between Insulating NiO*, Physical Review B., vol. 53, No. 14, pp. 9108-9114, Apr. 1, 1996." should read -- H. J. M. Swagten et al., *Enhanced Giant Magnetoresistance in Spin-Valves Sandwiched Between Insulating NiO*, Physical Review B., vol. 53, No. 14, pp. 9108-9114, Apr. 1, 1996. --.

Column 5,
Lines 46-47, read "…advantageously, the inert carrier gas 112 flow is 200-300 seem and the oxygen gas 156 flow is 10-35 sccm. In an…" and should read -- … advantageously, the inert carrier gas 112 flow is 200-300 sccm and the oxygen gas 156 flow is 10-35 sccm. In an… --.

Column 6,
Lines 42-43, read "...breaking vacuum i.e. the cluster ion beam oxidation is preformed "in-situ". Any appropriate known method may be used for…" and should read -- ...breaking vacuum i.e. the cluster ion beam oxidation is performed "in-situ". Any appropriate known method may be used for… --.

UNITED STATES PATENT AND TRADEMARK OFFICE
CERTIFICATE OF CORRECTION

PATENT NO. : 6,800,565 B2
DATED : October 5, 2004
INVENTOR(S) : Hu et al.

It is certified that error appears in the above-identified patent and that said Letters Patent is hereby corrected as shown below:

Column 8,
Line 48, reads "...formed by CIEB oxidation and natural oxidation, the..." and should read -- ...formed by the CIB oxidation and natural oxidation, the... --.

Signed and Sealed this

Twenty-third Day of August, 2005

JON W. DUDAS
*Director of the United States Patent and Trademark Office*